United States Patent
Casim et al.

(10) Patent No.: US 8,656,236 B2
(45) Date of Patent: Feb. 18, 2014

(54) REMOTE BOUNDARY SCANNING

(75) Inventors: Kamran H Casim, Rocklin, CA (US);
Russ W Herrell, Fort Collins, CO (US);
Martin Goldstein, Campbell, CA (US)

(73) Assignee: Hewlett-Packard Development Company, L.P., Houston, TX (US)

( * ) Notice: Subject to any disclaimer, the term of this patent is extended or adjusted under 35 U.S.C. 154(b) by 0 days.

(21) Appl. No.: 13/527,940

(22) Filed: Jun. 20, 2012

(65) Prior Publication Data
US 2013/0346815 A1    Dec. 26, 2013

(51) Int. Cl.
*G01R 31/28* (2006.01)

(52) U.S. Cl.
USPC ............ 714/727; 714/726; 714/729; 714/30; 714/724; 714/37; 709/203; 703/24; 703/28; 717/134

(58) Field of Classification Search
None
See application file for complete search history.

(56) References Cited

U.S. PATENT DOCUMENTS

| | | | |
|---|---|---|---|
| 6,578,167 B2 * | 6/2003 | Boorom et al. | 714/727 |
| 7,017,081 B2 * | 3/2006 | Gomez | 714/30 |
| 7,047,462 B2 | 5/2006 | Brown | |
| 7,095,718 B1 * | 8/2006 | Terry | 370/241 |
| 7,200,632 B1 * | 4/2007 | Greschler et al. | 709/203 |
| 7,343,591 B2 | 3/2008 | Szewerenko | |
| 8,161,336 B1 * | 4/2012 | Azimi et al. | 714/724 |
| 2003/0131136 A1 | 7/2003 | Emerson | |
| 2003/0225566 A1 * | 12/2003 | O'Brein et al. | 703/24 |
| 2006/0179374 A1 | 8/2006 | Noble | |
| 2009/0259739 A1 | 10/2009 | Cartes | |
| 2010/0107146 A1 * | 4/2010 | Wrighton et al. | 717/134 |
| 2011/0194425 A1 * | 8/2011 | Li et al. | 370/252 |
| 2012/0331348 A1 * | 12/2012 | La Fever et al. | 714/37 |
| 2013/0091587 A1 * | 4/2013 | La Fever et al. | 726/28 |

* cited by examiner

*Primary Examiner* — John Trimmings
(74) *Attorney, Agent, or Firm* — Francisco-Javier Rubio-Sierra (57) ABSTRACT

Techniques related to remotely boundary scanning of an integrated circuit embedded in a target computing system are disclosed herein. In an example, a host computing system includes a first peripheral port and a second peripheral port. A port-to-port boundary scan assembly is to interface boundary scan data between the first and the second peripheral ports. Thereby the boundary scan data can be routed from the second peripheral bus to the target computing system via a network port at the host computing system.

19 Claims, 4 Drawing Sheets

REMOTE BOUNDARY SCANNING

BACKGROUND

Communicating with an embedded system (e.g, a CPU embedded in a server) may be challenging due to the fact that embedded systems may lack a user interface, such as keyboards, monitors, or disk drives that are present on computers. Further, at least some integrated circuits (IC) include a high number of pins densely arranged to provide connection with external devices. It may be difficult to physically access external connectors of an embedded IC in view of the high pin density. Boundary scanning is a method for communicating with an embedded IC that overcomes the need to connect individual ICs.

The Joint Test Action Group (JTAG) developed a specification for boundary scan that was standardized in 1990 as the IEEE 1149.1-1990. The Boundary Scan Description Language (BSDL) describes the boundary-scan logic content of IEEE 1149.1 compliant devices. Boundary scan performed according to a IEEE standard 1149 is hereinafter referred to as JTAG boundary scan or, simply, JTAG. JTAG was originally developed to solve issues arising from the manufacturing of electronic circuits. However, JTAG is presently applied for other uses such as programming, debugging, and probing a port of an IC.

A computing system may be equipped with boundary scanning software for performing boundary scanning of an IC embedded in a target system. Such a computing system is hereinafter referred to as a boundary scanning system. An example of a boundary scanning system is a testing computer system including a module for running a diagnostics software for testing a server system, which in this example represents the target system. Such diagnostics software may operatively communicate with a JTAG bus in the target computer system by outputting testing data to a peripheral port (e.g., a USB port) connected to the JTAG bus via an interfacing peripheral (e.g., a USB-JTAG cable).

However, cable connecting the peripheral port to the JTAG bus may be inconvenient. For example, a cable connection may require opening the target computing system for accessing the JTAG bus. Further, a cable connection requires an on-site disposition of the testing computing system with respect to the target computer system. Therefore, a physical connection for performing JTAG may be cumbersome and time consuming merely by the fact that a direct physical access to the JTAG bus at the target computer system as well as co-location between the boundary scanning system and the target computing system are required.

BRIEF DESCRIPTION OF THE DRAWINGS

In order that the present disclosure may be well understood, various examples will now be described with reference to the following drawings.

DETAILED DESCRIPTION

In the following description, numerous details are set forth to provide an understanding of the examples disclosed herein. However, it will be understood that the examples may be practiced without these details. While a limited number of examples have been disclosed, it should be understood that there are numerous modifications and variations therefrom.

As set forth above, according to some conventional techniques, boundary scanning may involve physically connecting the peripheral port to a boundary scanning port of a target computing system. For example, boundary scanning may involve connecting the USB port of a testing system to a JTAG port in a server system to be tested using a USB-JTAG connector. (As used herein, the term "server system" refers to a computer hardware system dedicated to running programs serving the requests of one or more client computers.)

However, such conventional techniques may be inconvenient due to the requirement of co-location of the system performing the boundary scan (e.g., a laptop hosting a diagnostics application) and the target computing system (e.g., a server system including an embedded IC to be tested such as a central processing unit, also known as CPU). Moreover, such conventional techniques may involve opening a chassis of the target computing system for accessing the boundary scanning port. This may be inconvenient for some particular types of target computing systems such as blade servers where opening the chassis may be cumbersome and time consuming.

In order to avoid such inconveniences, boundary scanning of an IC embedded in a target computing system may be performed remotely. For example a boundary scan master (e.g., a JTAG master) may be embedded in a remote management controller at a target computing system (e.g., a server system). An example of a remote management controller is illustrated with respect to FIG. 1. The boundary scan master is adapted to perform command and control functions on a range of IC components within the target computing system. Further, the target computing system may include a network interface (e.g., an Ethernet interface) that provides for external communication interfacing between the remote server management controller and the outside world.

A system for performing remote boundary scanning of the target computing system (hereinafter referred to as boundary scanning system) may then perform boundary scanning management at components of the target computing system using remote access via the network interface. For performing boundary scanning, the boundary scanning system (in particular, a host computing system) is equipped with a boundary scanning engine. For example, the boundary scanning engine may include diagnostics software that manages JTAG data for testing a target computing system.

However, at least some boundary scanning engines are designed for performing boundary scanning in situ and not for remotely accessing the target system via a network (e.g., a server via an Ethernet interface). For example, some boundary scanning engines are designed for managing boundary scan data through a USB port at the boundary scanning system; the USB port is then connected to a JTAG port internally provided in a server system via a USB-JTAG cable when boundary scanning is required. Adapting a boundary scanning engine for remotely accessing a target system via a network interface may involve time-consuming re-programming of the engine.

Various examples described below facilitate remote boundary scanning of an IC (e.g., a CPU) embedded in a target computing system (e.g., a server system). In particular, as described in at least some examples herein, a host computing system (i.e., a laptop) may include a boundary scanning engine (e.g., a diagnostics software) to manage boundary scan data (e.g., data for JTAG testing) for performing boundary scanning (e.g., JTAG) of the IC in the target computing system; during boundary scanning operation, the boundary scanning engine communicates with a first peripheral port of the host computing system for accessing a target computing system (e.g., a server system); a port-to-port boundary scan assembly interfaces the boundary scan data between the first peripheral port and a second peripheral port of the host computing system. Further, the boundary scan data can be routed from the second peripheral bus to the target computing system via a network port at the host computing system.

As used herein, interfacing the boundary scan data between the first and second peripheral port refers to the port-to-port boundary scan assembly being configured to process the signal carrying the boundary scanning data for transmission thereof between the peripheral ports. As illustrated in the examples set forth below, this interfacing generally involves adapting of the signal carrying the boundary scanning data to the communication protocol of the peripheral bus ports. It will be understood that the specific configuration of the interfacing depends on the specific environment in which the port-to-port boundary scan assembly is to be implemented and depends on, among other factors, the specific configuration of the peripheral ports and connections with the port-to-port boundary assembly and format of the boundary scan data. This interfacing is generally bi-directional but, for some specific applications, it may be uni-directional.

According to some examples herein, the port-to-port boundary scan assembly is a computer peripheral assembly. As used herein, a computer peripheral assembly is a device that, in operation, is connected to a host computer, but is not part of it. Functionality of the computer peripheral assembly is dependent on the host device. For example, if the host device is provided with two USB ports for external communications, the computer peripheral assembly is designed to bypass communications using a USB protocol. In other example, the port-to-port boundary scan assembly may be a module integrated in the host computing system.

Therefore, some examples described herein facilitate using a boundary scanning engine (e.g., a diagnostics software) designed to perform in-situ boundary scanning (e.g., through a USB-JTAG connector) for remote boundary scanning.

In some technical contexts, boundary scanning is sometimes used as a synonymous with JTAG. However, the term "boundary scan" as used herein refers generally to methods for communicating with an embedded IC via interconnects provided in the IC, the interconnects being dedicated for boundary scan (e.g., a JTAG bus). Boundary scan may be applied for implementing a variety of tasks such as solving manufacturing issues of ICs as well as programming, debugging, and probing a port of an IC.

As used herein, an embedded IC refers to a piece of electronic hardware forming part of some larger computing system (also referred to as container system). The embedded IC may be loaded (or configured to be loaded with) software. Further, an embedded IC may include a microprocessor. In contrast to a personal computer, an embedded IC is expected to function without human intervention. A non-limiting example of an embedded IC is a CPU embedded in a server system. Other examples include, but are not limited to, flash memory, PROMs, CPLDs and FPGAs. An example of an embedded IC may include a single microcomputer with software in ROM, which starts running some special purpose application program as soon as it is turned on and does not stop until it is turned off.

An embedded IC may be configured to run an operating system. Alternatively, an embedded IC may be configured to run an application. Embedded ICs may be implemented without peripherals such as a keyboard, monitor, serial connections, mass storage, etc. or any kind of user interface software unless these are required by the container system of which it is a part. Some embedded ICs are configured to provide real-time response.

Figure 1:
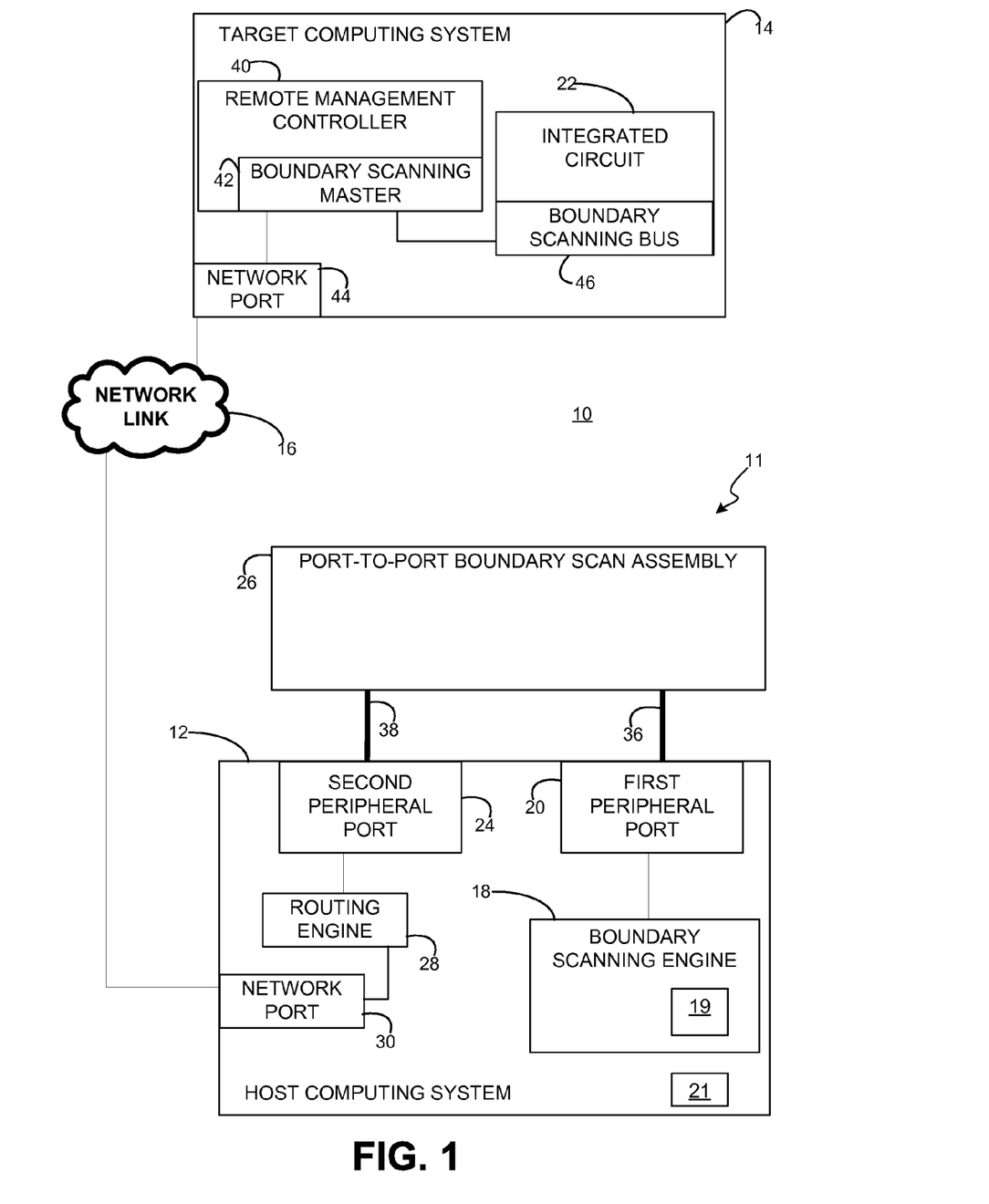
FIG. 1 depicts an environment in which various examples may be implemented.

FIG. 1 depicts an environment 10 in which various examples may be implemented. Environment 10 is shown to include a host computing system 12 (hereinafter referred to as host 12) connected via a network link 16 to a target computing system 14 (hereinafter referred to as target 14). Host 12 forms part of a boundary scanning system 11 for remotely performing boundary scanning of an embedded IC 22 embedded in target computing system 14.

Host 12 is configured for running a boundary scanning software. In the exemplary embodiment of FIG. 1, host 12 includes a boundary scanning engine 18 to manage boundary scan data at host 12. The boundary scan data is for performing boundary scanning of embedded IC 22. A specific example of boundary scan data is illustrated below with respect to FIG. 3.

Host 12 further includes a first peripheral port 20. During operation of host 12 for performing boundary scan, engine 18 communicates with first peripheral port 20 for accessing target 14 and, more specifically, embedded IC 22 embedded therein. Host 12 further includes a second peripheral port 24. A port-to-port boundary scan assembly 26 is arranged to interface boundary scan data between first peripheral port 20 and second peripheral port 24. Host 12 further includes a routing engine 28 for routing data from second peripheral bus 24 to target 14 via a network port 30. Thereby the boundary scan data can be routed from second peripheral bus 24 towards target 14 via network port 30.

Boundary scanning engine 18 represents, generally, any combination of hardware and programming configured to manage boundary scan data for performing boundary scanning of an IC embedded in a target computing system. This management of boundary scan data further includes boundary scan of a chain of embedded ICs, which is further illustrated below with respect to JTAG. In the illustrated example, boundary scanning engine 18 is illustrated as a separated unit. However, it will be understood that its functionality may be distributed over multiple sub-units.

Managing boundary scan data may include at least one of the following (1) generating the boundary scanning data, or (2) processing boundary scanning data associated with a particular state of embedded IC 22 and generated at target 14. Boundary scanning engine 18 may include a non-transitory medium 19 readable by a processor 21, the medium having stored thereon a set of instructions for performing boundary scanning. More specifically, boundary scanning engine 18 may be configured to run a boundary scanning software that uses a peripheral port for interfacing boundary scan data.

As illustrated by FIG. 1, boundary scanning engine 18 performs boundary scanning of network link 16 by communicating with first peripheral port 20. More specifically, the boundary scan data is interfaced with first peripheral port 20. For example, if first peripheral port 20 is configured as a USB port, boundary scanning engine 18 outputs boundary scanning data into first peripheral port 20 according to a USB communication standard protocol.

Peripheral ports 20, 24 represent generally any type of external computer buses. More specifically, first and second peripheral ports 20 and 24 may be configured for enabling transfer of data between host 12 and an external device, such as port-to-port boundary scan assembly 26 through an appropriate interface, e.g., a suitable connector. Such external computer buses include parallel buses and serial buses. Examples of external computer buses include, but are not limited to HIPPI, IEEE-488, PC Card, CAN, EIA-485, eSATA or IEEE 1394 interfaces. It will be understood that host 12 may include further peripheral ports in addition to ports 20, 24.

According to some examples at least one of ports 20, 24 is a USB port. Configuring any of ports 20 or 24 as a USB port facilitates interfacing of the boundary scan data, since a variety of devices is equipped with USB ports. Further, new USB communications protocol is designed for compatibility with previous versions. Further, USB is generally faster for streaming large amount of data as compared to a parallel port. Moreover, a number of software packages for performing boundary scanning are configured to communicate with a USB port. An example of such a software package is the Intel 0 JTAG Debugger for Intel® Atom™ as described in the paper by Robert Müller-Albrecht (Device Driver Debussing on Intel® Atom™ processor based devices, Intel Document Number 319429-002US).

Routing engine 28 represents generally any combination of hardware and programming configured to provide a routing service that enables to route data from second peripheral port 24 to a remote computing system (e.g., target 14) via network port 30. For example, boundary scanning engine 18 may include a non-transitory medium readable by a processor, the medium having stored thereon a set of instructions for performing such a routing service. More specifically, boundary scanning engine 18 may be configured to run a boundary scanning software that facilitates routing of data as described herein. For example, the routing of data may be based on a TCP/IP routing protocol. It will be understood that a routing engine as referred to herein is not limited to a TCP/IP routing protocol but it may be based on any routing technique suitable for interfacing boundary scan data as described herein. Routing engine 28 may be based on an independently running software (e.g., GNU Zebra, Quagga, or Iproute) or may form part of a more generic operative module, such as an operating system running in host 12. According to an examber a subclass of Data Center Enhanced Ethernet may be used to facilitate low-loss high prioritized communication. Thereby, public Fibre Channel over Ethernet (FCoE) or Peripheral Component Interconnect express (PCIe) implementations may be leveraged.

According to at least some examples, routing engine 28 is configured to securely route the data. For example, routing engine 28 may be configured to forward data packets containing the boundary scanning data using a network protocol for secure communication such as, but not limited to, a Secure Shell (SSH) protocol.

Network port 30 represents generally a communication endpoint in an operating system running in host 12 that allows communication between host 12 and a remote system via 16. According to some examples, network port 30 is an Ethernet port. Ethernet port facilitates boundary scanning of a remote system in view of its compatibility and ubiquitous interfacing. However, it will be understood that network port 30 is not limited to an Ethernet port but encompasses any type of port that enables transmission of boundary scanning data via a network link as described herein.

Port-to-port boundary scan assembly 26 represents generally a device configured to transmit boundary scan data generated with respect to embedded IC 22 between peripheral ports 20 and 24. According to at least some examples, port-to-port boundary scan assembly 26 is configured to work bi-directionally. That is, port-to-port boundary scan assembly 26 may be configured to transmit and process boundary scan data (a) from port 20 to port 24 and (b) from port 24 to port 20. Option (a) may take place for transmitting boundary scan data generated by boundary scanning engine 18 (for example data generated to sending some query data generated by boundary scanning engine 18 to boundary scanning pins in embedded IC 22). Option (b) may take place for transmitting boundary scan data generated by embedded IC 22 to boundary scanning engine 18 (for example data outputted from boundary scanning pins in embedded IC 22 in response to a query from boundary scanning engine 18).

In at least some embodiments herein, as illustrated by FIG. 1, port-to-port boundary scan assembly 26 is a computer peripheral assembly. More specifically, in operation, port-to-port boundary scan assembly 26 is connected to host 12 but does not form part thereof. Further examples of a port-to-port boundary scan assembly 26 are illustrated below with regard to FIGS. 2 to 4.

Figure 2:
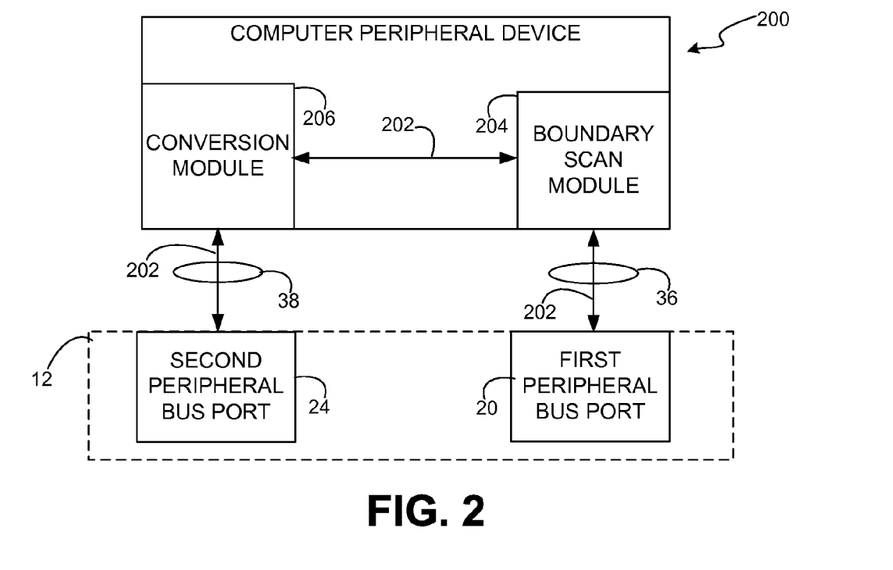
FIG. 2 depicts a computer peripheral assembly according to examples herein.

FIG. 2 illustrates an example of a computer peripheral assembly 200 (hereinafter referred to as device 200) for communicatively coupling boundary scan data 202 between first peripheral port 20 and second peripheral port 24. Device 200 is a specific example of port-to-port boundary scan assembly 26. However, it will be understood that the example of FIG. 2 is non-limiting and that there is a variety of possible configurations of port-to-port boundary scan assembly 26 for transmitting boundary scan data between a first peripheral port and a second peripheral port of a host system.

Device 200 includes a boundary scan module 204 for interfacing boundary scan data 202 with first peripheral port 20. More specifically, boundary scan module 204 may be configured for transmitting boundary scan data 202 into first peripheral port 20 via a connection 36 and/or receiving boundary scan data 202 from first peripheral port 20 via connection 36. Boundary scan module 204 may be constituted merely as a port configured to interface boundary scan data 202 with first peripheral port 20 via connection 36. Alternatively, boundary scan module 204 may also include conversion sub-modules for shaping the signal carrying boundary scan data 202 so that it can be suitably interfaced with first peripheral port 20 and a conversion module 206. A non-limiting example of boundary scan data 202 is illustrated with respect to FIG. 3. It will be understood that the specific configuration of boundary scan module 204 depends on the specific environment in which the port-to-port boundary scan assembly is to be implemented and depends on, among other factors, the specific configuration of peripheral port 20, connection 36, conversion module 206 as well as the format of boundary scan data 202.

As mentioned above, device 200 also includes a conversion module 206 for interfacing boundary scan data 202 with second peripheral port 24. More specifically, conversion module 206 may be configured for transmitting boundary scan data 202 into second peripheral port 24 via connection 38 and/or receiving boundary scan data 202 from first peripheral port 20 via connection 38. Generally, boundary scan module 204 is configured to shape the signal conveying boundary scan data 202 so that it can be suitably interfaced with second peripheral port 24 and boundary scan module 204. A non-limiting example of conversion module 206 is illustrated with respect to FIG. 3. Alternatively, conversion module 206 may be constituted merely as a port configured to interface boundary scan data 202 with second peripheral port 24 via connection 38. It will be understood that the specific configuration of conversion module 206 depends on the specific environment in which the port-to-port boundary scan assembly is to be implemented and depends on, among other factors, the specific configuration of peripheral port 24, connection 38, boundary scan module 204 as well as the format of boundary scan data 202.

In the illustrated example, boundary scan module 204 and conversion module 206 are communicatively coupled to each other for transmission of boundary scan data 202. In FIG. 2, boundary scan module 204 and conversion module 206 are illustrated as separated modules. However, they may be integrated in a single operating module. Alternatively, their functionality may be distributed over multiple sub-modules.

Figure 3:
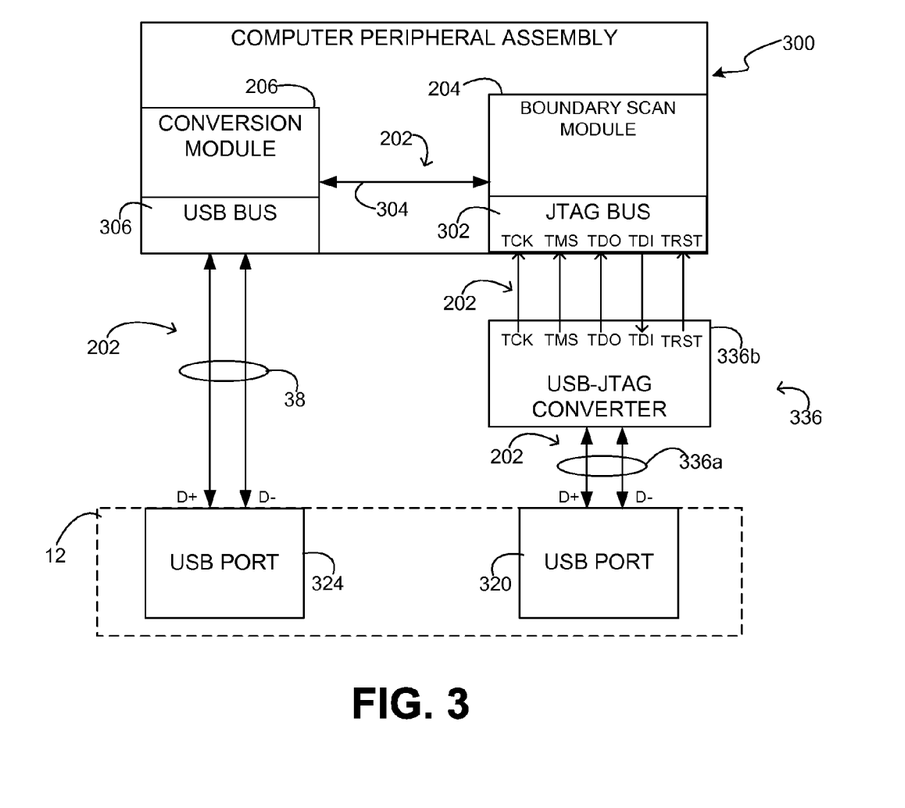
FIG. 3 depicts a computer peripheral assembly according to other examples herein

FIG. 3, described below, illustrates an example of a specific configuration of boundary scan module 204 and conversion module 206. The example of FIG. 3 is illustrated with respect to the JTAG protocol as boundary scanning method and USB port as peripheral ports. However, it will be understood that neither the boundary scanning method nor the peripheral port in the present disclosures are limited to these examples.

Referring back to FIG. 1, host computing system host 12 and target computing system 14 interact with each other via a network link 16 that represents, generally, one or more of a cable, wireless, fiber optic, or remote connections via a telecommunication link, an infrared link, a radio frequency link, or any other connectors or systems that provide electronic communication. Link 16 may include, at least in part, an intranet, the Internet, or a combination of both. Link 16 may also include intermediate proxies, routers, switches, or load balancers.

Target 14 represents generally a computing device including an embedded IC that can be managed using boundary scanning Target 14 may be constituted as a server system connected to client systems (not shown) via network link 16.

In the illustrated example, target 14 includes a remote management controller 40 for facilitating remote management of target 14. Remote management controller 40 provides general control and functions as a management processor for remotely controlling target 14 from a host computing system such as host 12. For implementing this function, remote management controller 40 may include an input/output processor ("IOP", not shown) such as, but not limited to, a 32-bit RISC processor. Remote management controller 40 may further include an embedded boundary scan master 42, such as a JTAG master, controllable by the IOP, the boundary scan master may include a boundary scan interface, such as a JTAG interface (not shown). Boundary scan master 42 is configured to be accessed remotely through remote management controller 40 to provide communication between host 12 and embedded IC 22 via a network port 44 provided at target 14. Network port 44 may be constituted similarly as network port 30 described above.

An example of a remote management controller is illustrated in U.S. Pat. No. 7,047,462, which is incorporated herein by reference in its entirety (to the extent in which this document is not inconsistent with the present disclosure) and in particular those parts thereof describing remote management controllers and techniques for remote management of a computing system such as target 14.

As set forth above, target 14 further includes embedded IC 22. It will be understood that target 14 may include one or more embedded ICs. If there is a plurality of embedded ICs, the ICs may be connected to form a boundary scan chain. For example, regarding JTAG as further detailed below, the TDI and the TDO pins of adjacent ICs may be connected to form a JTAG chain. Embedded IC 22 includes a boundary scanning bus 46 for interfacing boundary scan data. Further ICs (not shown) may be connected to embedded IC 22 through boundary scanning bus 46 for forming a boundary scan chain.

FIG. 3 illustrates an example of a computer peripheral assembly 300 with a specific configuration of boundary scan module 204 and conversion module 206 that uses JTAG as the boundary scanning protocol.

The JTAG architecture may be envisioned as a large scan chain, in which JTAG-compatible ICs on a circuit board are all connected in series (like a chain) that is accessible through a JTAG bus. (In the Figures, only one IC is illustrated for the sake of simplicity.) Information from each IC in the chain is sequentially made available at the JTAG bus. Thus, information from each IC may be shifted from IC to IC around the boundary scan chain.

Modern microprocessors and chipsets support JTAG and are good examples of devices that allow access and control of many internal functions through an on-board JTAG interface. In fact, Intel Corporation, a major manufacturer of microprocessors and chipsets, has adopted the JTAG architecture as part of its In-Target Probe ("ITP") and In-Circuit Emulation ("ICE") test methodologies. ITP and ICE employ standard JTAG signals, plus a few others. The ITP and ICE methodologies are widely used to troubleshoot and configure microprocessors, chip sets and other chips.

In the example of FIG. 3, the communications protocol between computer peripheral assembly 300 and the peripheral ports at host 12 is based on USB. More specifically, the first and second peripheral ports referred to above are constituted in this example as USB ports 320 and USB bus 324. USB port 320 interfaces boundary scan data 202 according to USB communications protocol as illustrated in the Figure. More specifically, USB port 320 interfaces boundary scan data 202 using two bidirectional signals D+ and D− that correspond to the signal transmission lines of the USB standard. It will be understood that the particular USB communication protocol may vary for different USB versions (e.g., USB 1.0, 2.0, or 3.0), and that the illustrated example is a simplified version thereof.

According to some examples, a boundary scanning system may include a JTAG connector for interfacing the peripheral port with the port-to-port boundary scan assembly and, more specifically, with the element connecting the assembly with the peripheral port (e.g., a JTAG bus). Referring to FIG. 3, element 336 is an example of a JTAG connector, more specifically it illustrates a USB-JTAG connector. It will be understood that a JTAG connector encompasses connectors for interfacing with other types of peripheral ports such as, but not limited to, an Ethernet or a serial port.

USB-JTAG connector 336 bi-directional carries boundary scan data 202 by processing a USB signal and a JTAG signal to implement communications between a JTAG bus 302 and USB port 320. In the illustrated example, USB-JTAG connector 336 includes a USB-JTAG connector 336a for being connected to USB port 320 and transmitting boundary scan data 202 according to a USB protocol (illustrated by the D+D− signal). USB-JTAG connector 336 further includes a USB-JTAG converter 336b that interfaces boundary scan data 202 between the USB bus 320 and boundary scan module 204 (more specifically, JTAG BUS 302).

Generally, the specific configuration of JTAG bus 302 depends on the specific format of boundary scan data 202, which depends on the specific embedded ICs being targeted and the communications protocol used by boundary scanning engine 18. Therefore, it will be understood that there is a variety of ways of implementing USB-JTAG connector 336. A non-limiting example of a USB-JTAG connector include a USB-JTAG programming cable manufactured by Digilent, Inc (WA). The present disclosure is not limited to commercialized USB-JTAG connector. USB-JTAG connector 336 may be a connector specifically tailored for a specific application of for remote boundary scanning as disclosed herein.

As illustrated in the Figure, in this example the JTAG includes four signals: a test data in signal (TDI), a test mode select signal (TMS), a test clock signal (TCK), and a test data out signal (TDO). This example also includes a test reset signal (TRST).

The TMS signal determines the sequence of progress through a state machine contained in the device with which the JTAG master is communicating (e.g., embedded IC 22 in target 14). The state sequence is determined by the state of the TMS pin on the rising edge of TCK. For devices in a scan chain, TMS has an internal resistive pull-up to provide logic high if the pin is not driven. The TCK signal is the JTAG test clock. It sequences the operation of a JTAG master and JTAG registers in the devices connected to a JTAG interface. On each embedded IC being targets by boundary scan data 202, the TDI signal is the serial input to all JTAG instruction and data registers. The state of the TAP controller and the current instruction held in the instruction register of the slave device determines which register the TDI pin is read into for a specific operation. TDI may have an internal resistive pull-up to provide logic high to the system if the pin is not driven. TDI is applied into the JTAG registers on the rising edge of TCLK. The TDO signal is the serial output for all JTAG instruction and data registers.

In addition to the JTAG signals identified above, the JTAG standard recognizes several optional signals, such as TRST (also illustrated in FIG. 3) and a variety of enable signals (not shown), which may be implemented in devices from various manufacturers. It will be understood that additional optional signals may be implemented to allow communication with devices of some manufacturers, depending on which functions have been implemented in the device.

JTAG bus 302 is a bus with pins are configured to interface with USB-JTAG connector 336 (more specifically, with USB-JTAG convertor 336b). In the illustrated example, JTAG bus includes a set of pins configured to interface the TCK, TMS, TDO, TDI, TRST signal set. It will be understood that specific configuration of the JTAG bus depends on the particularly used JTAG interface.

Boundary scan module 204 is communicatively connected with conversion module 206 for carrying boundary scan data 202 through a carrier signal carrier signal 304. In an example, carrier signal 304 corresponds to the same interface used for communications between USB-JTAG connector 336 and JTAG bus 302. That is, referring to the specific example of FIG. 3, carrier signal 304 may correspond to a TCK, TMS, TDO, TDI, TRST signal set. In that case, functionality of boundary scan module 204 is merely limited to the interfacing provided by JTAG-BUS 302. In other examples, boundary scan module 204 performs a further processing of the signal set interfaced through JTAG bus 302. The specific configuration of such a processing depends on the specific configuration of conversion module 206 as well as connector 336. More specifically, boundary scan module 204 may be configured to process a signal from USB-JTAG connector 336 for complying with the requirements set by conversion module 206. Since boundary scan module 204 may work bi-directionally (i.e., it does not only interfaces boundary scan data 202 from USB-JTAG connector 336 into conversion module 206 but also boundary scan data 202 from conversion module 206 into USB-JTAG connector 336), it may be configured to process a signal from conversion module 206 according to the specific configuration of USB-JTAG connector 336 so that boundary scan data 202 from an embedded IC in target 14 is be transmitted towards boundary scanning engine 18.

Conversion module 206 is configured to interface boundary scan data 202 with USB bus 324 according to the USB communications protocol. In the illustrated example, conversion module 206 includes a USB bus 306 for that purpose. For communicating boundary scan data 202 towards an embedded IC in target 14, conversion module 206 is configured to process carrier signal 304 so that boundary scan data 202 can be interfaced through USB bus 306 towards USB bus 324 via connection 38. For communicating boundary scan data 202 towards boundary scanning engine 18, conversion module 206 is configured to process the USB signal (D+, D−) from USB bus 324 so that boundary scan data 202 can be interfaced as carrier signal 304 into boundary scan module 204. It will be understood that the specific configuration of such a processing depends on the specific communications protocol being used for a particular boundary scanning application.

In an example, the conversion module is designed to maintain the data being interfaced for boundary scanning while transforming the transport and link layers of the carrier signal for implementing its function. Further, the conversion module may generate acknowledgment and/or retry messages for supporting the additional peripheric loop that it implements in the communications chain. In some implementations, the conversion module may add some latency in the communications change. The boundary scanning engine may be configured to compensate this latency.

Figure 4:
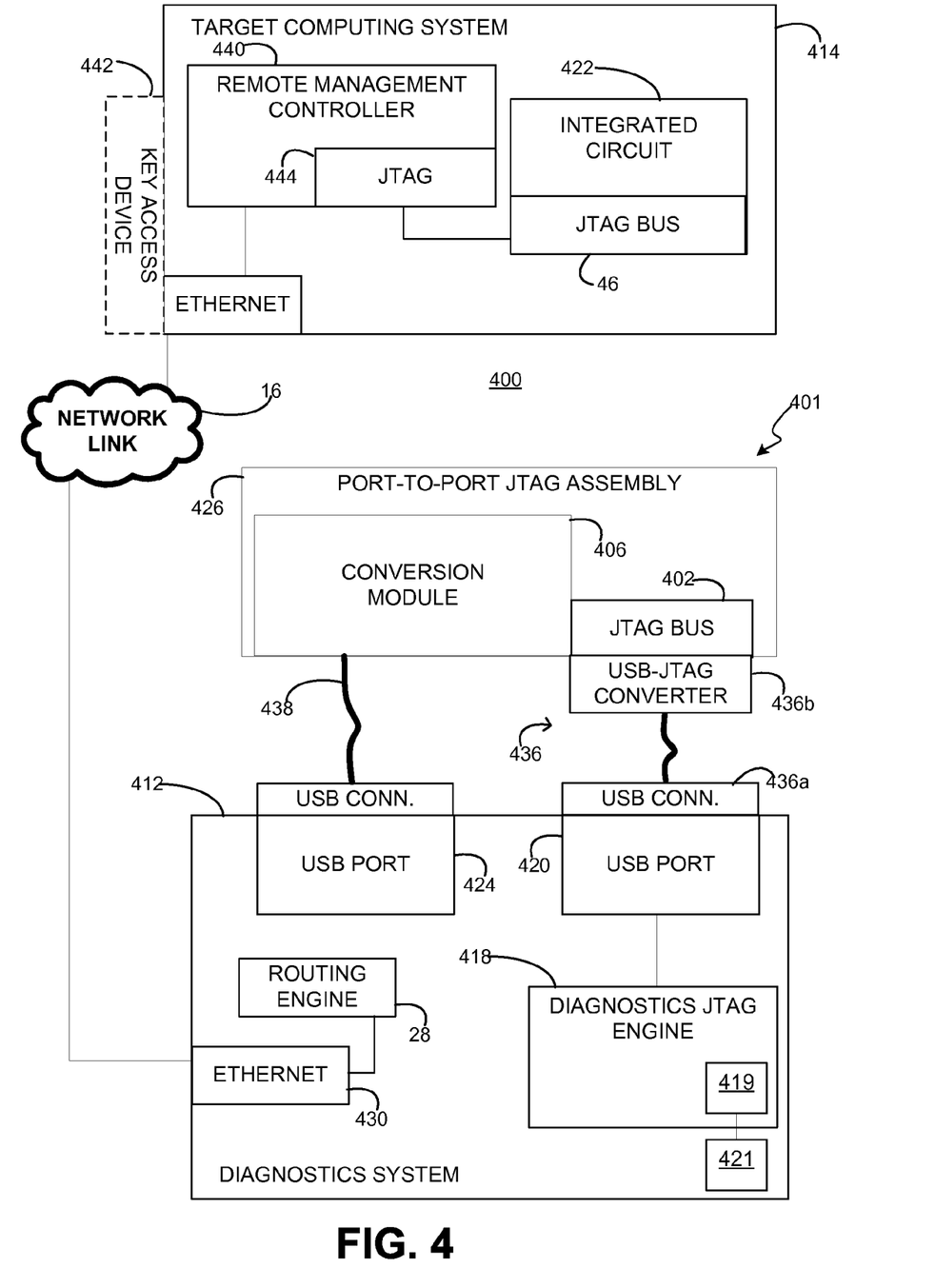
FIG. 4 depicts another environment in which various examples may be implemented.

FIG. 4 depicts another environment 400 in which various examples may be implemented. The example of FIG. 4 summarizes some of the concepts set forth above regarding a USB-JTAG interface. Environment 400 illustrates a specific example of a boundary scanning system 401 for remotely performing boundary scanning (in this example based on JTAG) of an integrated circuit 422 embedded in a target computing system 414.

System 401 includes a diagnostics system 412 and a port-to-port JTAG assembly 426. Diagnostics system 412 is to perform diagnostics of one or more embedded ICs in a target computing system, in this example, IC 422 embedded in target 414. Diagnostics system 412 includes a diagnostics JTAG engine 418, which represents generally any combination of hardware and programming configured to performs diagnostics of an embedded system using the JTAG protocol via a peripheral port (in this example, a USB port). For example, engine 418 may include a non-transitory medium 419 readable by a processor 421, the medium having stored thereon a set of instructions for performing JTAG diagnostics. More specifically, JTAG engine 418 may be configured to run JTAG diagnostics software (e.g., for "in-circuit" diagnostics) that uses a USB port for interfacing JTAG data.

Diagnostics system 412 further includes USB ports 420, 424, routing engine 428, and an Ethernet port 430. JTAG engine 418 communicates for interfacing of JTAG data. USB port 424 communicates with communicates with routing engine 28 for forwarding JTAG data towards 414 via network link 16.

JTAG data is transmitted between USB ports 424 and 420 via USB-JTAG connector 436, port-to-port JTAG assembly 426, and connector 438. USB-JTAG connector 436 may include a USB connector 436a for being communicatively connected to USB port 420 and a USB-JTAG converter 436b for interfacing JTAG data with USB-JTAG connector 436. Port-to-port JTAG assembly 426 in this example includes a JTAG bus 402 to interface JTAG data with USB port 424. More specifically, JTAG bus 402 is for interfacing JTAG data according to the JTAG scan protocol. JTAG bus 402 is a specific example of a boundary scanning module mentioned above with respect to FIGS. 2 and 3. Port-to-port JTAG assembly 426 in this example further includes a conversion module 406 to interface JTAG data with USB port 424. More specifically, conversion module 406 is configured to convert the signals between JTAG bus 402 and USB port 424 so that JTAG data can be bi-directionally transmitted, for example as detailed above with respect to FIG. 3.

Target computing system 414 is constituted analogously to target 14 illustrated above with respect to FIG. 1. Remote management controller 440 is configured to communicate with embedded IC 422 through a JTAG master 444 according to the JTAG communications protocol. According to some examples, a key access device 442 may be used to physically confirm remote access of target computing system 414 by diagnostics system 412. Key access device 442 may be constituted by a USB key, although not limited thereto.

In an example, target system 414 is a server hosted at a server operator facility while diagnostic systems 412 is hosted at a remote site and operated by a server manufacturer. Environment 400 facilitates remote "in circuit emulation" diagnostics of the server at the customer's environment by routing the data traffic over Ethernet to the server's management processor. Thereby, diagnostics of components (e.g., CPUs or ASICs) at the server may be performed without requiring opening of the server chassis or co-location of the diagnostics and target systems. Moreover, port-to-port JTAG assembly facilitates using a diagnostics JTAG engine for remote diagnostics, even if the engine is initially conceived to perform diagnostics using a peripheral port with co-location of the target system, i.e., without using a network link.

Figure 5:
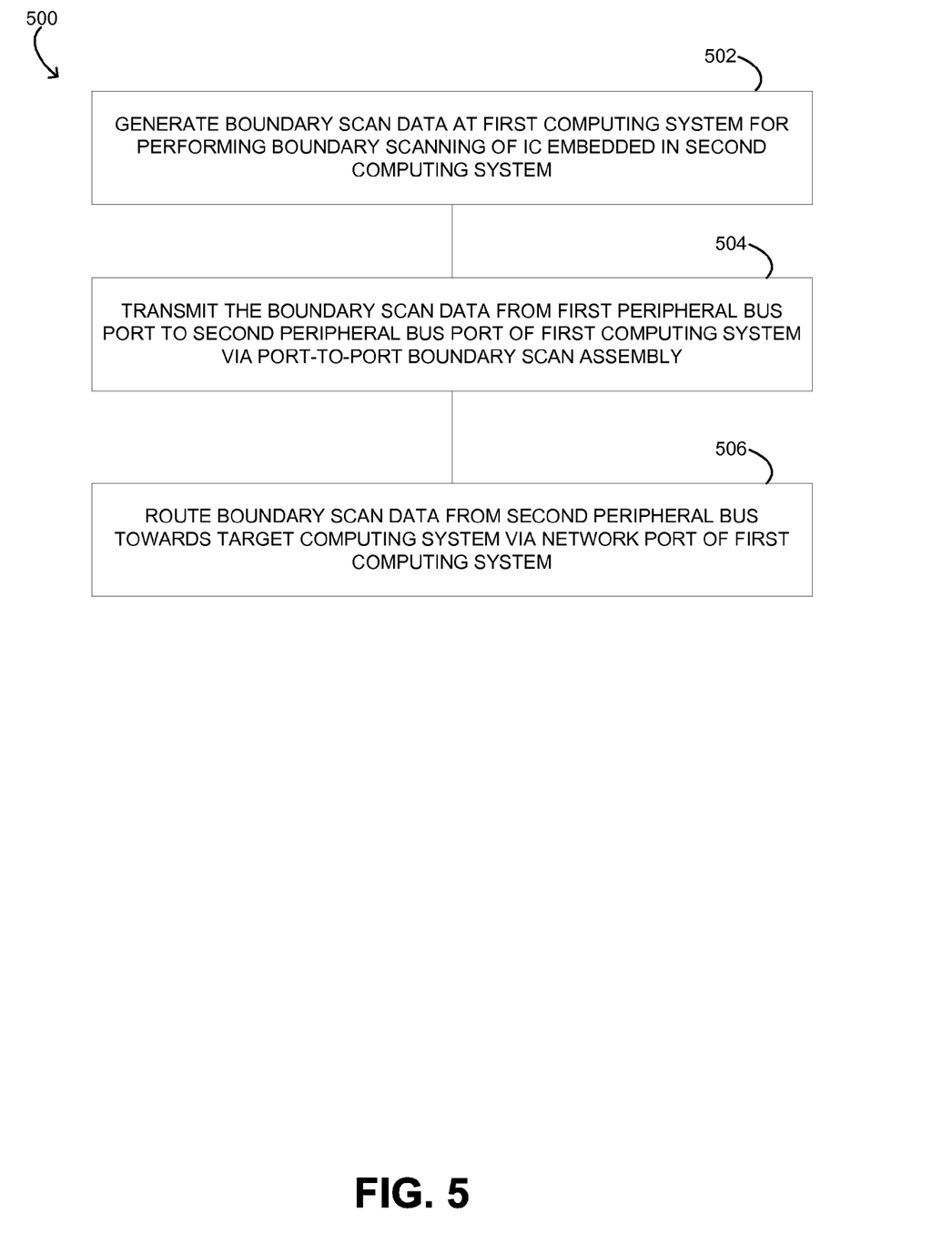
FIG. 5 is a flow diagram for implementing examples.

FIG. 5 illustrates a process flow 500 for remotely performing boundary scanning of an integrated circuit embedded in a target computing system. Process flow 500 may be implemented using a boundary scanning system according to examples herein. In discussing the example of FIG. 5, reference is made to the diagrams in FIGS. 1 to 4 to provide contextual examples. However, it will be understood that implementation is not limited to those examples.

Process flow 500 includes a block 502 in which boundary scan data (e.g. data 202) is generated at a first computing system (e.g., host 12, or 412) for performing boundary scanning of an integrated circuit embedded (e.g., IC 22 or 422) in a second computing system (e.g., target 14 or 414). The boundary scan data is interfaced with a first peripheral port (e.g., port 20, USB bus 320, or 420) of the first computing system according to a communication protocol of the first peripheral port (e.g., a USB communication protocol if implemented in the examples of FIG. 3 or 4; it will be understood that the communication protocols may be an alternative protocol depending on the particularly used peripheral port). A boundary scanning engine such as engine 18, or engine 418 may be responsible for the generation of the boundary scan data (in the latter example, the boundary scan communication protocol is a JTAG communication protocol).

At block 504. the boundary scan data is transmitted from the first peripheral port to a second peripheral port (e.g. port 24, USB bus 324, or 424) of the first computing system via a port-to-port boundary scan assembly (e.g., module 26 or 426, or device 200 or computer peripheral assembly 300) that interfaces the boundary scan data into the second peripheral port of the first computing system according to a communication protocol of the second peripheral port (e.g., a USB communication protocol implemented in the examples of FIG. 3 or 4; it will be understood that the communication protocols may be an alternative protocol depending on the particularly used peripheral port).

Block 504 may include transmitting the boundary scan data into a boundary scan interface in the computer peripheral assembly. Any of module boundary scan module 204 or bus 402 may be responsible of implementing the boundary scan interface.

Block 504 may further include effecting that the signal conveying boundary scan data is inputted into the boundary scan port conforms the boundary scan communication protocol. For example, a converter such as USB-JTAG converter 436 may be responsible for implementing this conversion.

At block 506, the boundary scan data from the second peripheral bus is routed towards the target computing system via a network port (e.g., port 30 or 430) of the first computing system. Routing the boundary scan data towards the target computing system may be performed upon a key access device (e.g., device 440) being connected to the target computing system.

It will be understood that examples herein may include analogous steps as described with respect to process flow 500 for transmission of the boundary scan data generated at the second computing system in response to the boundary scan sent from the first computing system, as illustrated above with respect to FIGS. 1 to 4.

As set forth above, boundary scanning as disclosed herein may be used for a variety of applications that involve remotely accessing an embedded IC. These applications may include boundary scanning as illustrated with respect to process flow 500. For example, boundary scanning as disclosed herein may be applied for remotely testing an IC embedded in a target computing system using boundary scan data as illustrated with respect to FIG. 5.

More specifically, boundary scanning may be used to test the operation of components in an embedded chain of ICs. The components may be instructed (via test vectors) to load signals, sample signals, bypass components, program or alter any device registers that are accessible through the particularly used boundary scanning protocol (e.g., JTAG).

Further, boundary scanning device access as described herein may also be used to remotely debug and configure ICs after installation on a circuit board and a target computing system. For example, JTAG compatible devices may be designed to have their own set of user defined instructions, such as CONFIGURE and VERIFY, which are accessible through a JTAG interface. User-defined characteristics may be used to control a wide variety of operational parameters of the device and to perform failure analysis after a device failure occurs.

If the embedded IC is configured to run software, testing may include in-circuit emulation diagnostics of the target computing system (e.g., a server). In-circuit emulation as used herein refers to debugging the software that an embedded IC in the server is configured to run using boundary scanning.

In addition to its support of device testing, debugging and configuring, boundary scanning as disclosed herein may be used to remotely program and reprogram a wide range of memory devices such as flash memory, PROMs, CPLDs and FPGAs implemented in a target computing system. For example, programming and reprogramming of these devices may be done via the JTAG interface after the devices are installed on a circuit board such as a system motherboard.

A specific application of the techniques disclosed herein is for implementing in target probe (ITP). ITP is aimed to control an embedded integrated circuit (e.g., a CPU or an ASIC) at the register level. It generally allows full control of the target device and facilitates accessing individual processor registers, program counter, and instructions within the device.

Process flow 500 as illustrated above may be used in the environment shown in FIG. 4 to process a JTAG output, convert it to Ethernet packets (JTAG to USB to Ethernet) and securely (SSH or equivalent) forward packets via Ethernet to a remote management controller at the target system. The remote management controller then forwards the packets to JTAG port on an embedded IC (e.g., a local CPU or ASIC). Communications in the reverse direction are handled in a similar manner.

It will be appreciated that embodiments can be realized in the form of hardware, software module or a combination of hardware and the software module. Any such software module, which includes machine-readable instructions, may be stored in the form of volatile or non-volatile storage such as, for example, a storage device like a ROM, whether erasable or rewritable or not, or in the form of memory such as, for example, RAM, memory chips, device or integrated circuits or on an optically or magnetically readable medium such as, for example, a CD, DVD, magnetic disk or magnetic tape. It will be appreciated that the storage devices and storage media are embodiments of a non-transitory computer-readable storage medium that are suitable for storing a program or programs that, when executed, for example by a processor, implement embodiments. Accordingly, embodiments provide a program comprising code for implementing a system or method as claimed in any preceding claim and a non-transitory computer readable storage medium storing such a program.

In the foregoing description, numerous details are set forth to provide an understanding of the examples disclosed herein. However, it will be understood that the examples may be practiced without these details.

While a limited number of examples have been disclosed, numerous modifications and variations therefrom are contemplated. It is intended that the appended claims cover such modifications and variations. Claims reciting "a" or "an" with respect to a particular element contemplate incorporation of one or more such elements, neither requiring nor excluding two or more such elements. Further, the terms "include" and "comprise" are used as open-ended transitions.

What is claimed is:

1. A boundary scanning system for remotely performing boundary scanning of an integrated circuit embedded in a target computing system, the boundary scanning system comprising:
    a host computing system including:
        a first peripheral port and a second peripheral port,
        a boundary scanning engine to manage boundary scan data for performing boundary scanning of the integrated circuit in the target computing system, wherein, during operation of the host computing system for boundary scanning, the first peripheral port interfaces the boundary scan data with the boundary scanning engine,
        a routing engine for routing data from the second peripheral port to the target computing system via a network port; and
    a port-to-port boundary scan assembly for interfacing the boundary scan data between the first peripheral port and the second peripheral port, whereby the boundary scan data can be routed from the second peripheral port to the target computing system via the network port.

2. The system of claim 1, wherein the port-to-port boundary scan assembly includes a conversion module for interfacing the boundary scan data with the second peripheral port of the host computing system according to a communications protocol of the second peripheral port.

3. The system of claim 1, wherein the port-to-port boundary scan assembly is a computer peripheral assembly communicatively connected to the host computing system for transmitting the boundary scan data between the first peripheral port and the second peripheral port.

4. The system of claim 1, wherein the boundary scanning corresponds to a JTAG communication protocol.

5. The system of claim 1, wherein at least one of the first or second peripheral port is a USB port.

6. The system of claim 1, wherein the network port is an Ethernet port.

7. The system of claim 1, wherein the port-to-port boundary scan assembly further includes a JTAG bus for interfacing the first peripheral port with the port-to-port boundary scan assembly.

8. The system of claim 1, wherein the boundary scanning engine is to manage the boundary scan data for performing a test of the integrated circuit in the target computing system.

9. A computer peripheral assembly for communicatively coupling boundary scan data between a first peripheral port of a host computing system and a second peripheral port of the host computing system, the peripheral assembly including:
    a boundary scan module for interfacing the boundary scan data with the first peripheral port; and
    a conversion module for interfacing the boundary scan data with the second peripheral port.

10. The system of claim 9, wherein the boundary scan data provided to the second peripheral port is routable to a target computing system to perform boundary scanning that corresponds to a JTAG communication protocol at the target computing system.

11. The system of claim 9, wherein at least one of the first or second peripheral port is a USB port.

12. A method for remotely performing boundary scanning of an integrated circuit embedded in a target computing system, the method comprising:
    generating boundary scan data at a first computing system for performing boundary scanning of the integrated circuit embedded in the target computing system, the boundary scan data being interfaced with a first peripheral port of the first computing system according to a communication protocol of the first peripheral port;
    transmitting the boundary scan data from the first peripheral port to a second peripheral port of the first computing system via a port-to-port boundary scan assembly that interfaces the boundary scan data into the second peripheral port of the first computing system according to a communication protocol of the second peripheral port; and
    routing the boundary scan data from the second peripheral port towards the target computing system via a network port of the first computing system.

13. The method of claim 12, wherein transmitting the boundary scan data from the first peripheral port to the second peripheral port of the first computing system includes:
    transmitting the boundary scan data into a boundary scan interface in a computer peripheral assembly, and
    effecting that a signal conveying the boundary scan data and inputted into the second peripheral port conforms to the communication protocol of the second peripheral port.

14. The method of claim 12, further including remotely testing the integrated circuit embedded in the target computing system using the generated boundary scan data.

15. The method of claim 14, wherein
    the target computing system includes a server,
    the integrated circuit includes a CPU, and
    the testing includes debugging software that the CPU is configured to run.

16. The method of claim 12, wherein routing the boundary scan data towards the target computing system is performed upon a key access device being connected to the target computing system.

17. The method of claim 16, wherein the key access device includes a USB key.

18. The system of claim 12, wherein the boundary scanning corresponds to a JTAG communication protocol.

19. The system of claim 12, wherein at least one of the first or second peripheral port is a USB port.

* * * * *